(12) United States Patent
Mathai et al.

(10) Patent No.: US 10,305,248 B2
(45) Date of Patent: May 28, 2019

(54) HIGH CONTRAST GRATING OPTOELECTRONICS

(71) Applicant: Hewlett Packard Enterprise Development LP, Houston, TX (US)

(72) Inventors: Sagi V. Mathai, Palo Alto, CA (US); Michael Renne Ty Tan, Palo Alto, CA (US); David A. Fattal, Palo Alto, CA (US); Wayne V. Sorin, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 16 days.

(21) Appl. No.: 15/028,549

(22) PCT Filed: Oct. 29, 2013

(86) PCT No.: PCT/US2013/067342
§ 371 (c)(1),
(2) Date: Apr. 11, 2016

(87) PCT Pub. No.: WO2015/065344
PCT Pub. Date: May 7, 2015

(65) Prior Publication Data
US 2016/0301188 A1 Oct. 13, 2016

(51) Int. Cl.
*G02B 5/18* (2006.01)
*H01S 5/022* (2006.01)
(Continued)

(52) U.S. Cl.
CPC ............ *H01S 5/02288* (2013.01); *G02B 5/18* (2013.01); *G02B 5/1809* (2013.01);
(Continued)

(58) Field of Classification Search
CPC ...... G02B 5/18; G02B 5/1809; G02B 5/1857; G02B 5/1866; G02B 6/34; G02B 6/4204–6/4206; H01S 5/02288
(Continued)

(56) References Cited

U.S. PATENT DOCUMENTS 4,729,640 A * 3/1988 Sakata ............... G02F 1/133371
349/137
5,285,466 A 2/1994 Tabatabale
(Continued)

FOREIGN PATENT DOCUMENTS

CN 103048715 4/2013
KR 20010003111 A 1/2001
(Continued)

OTHER PUBLICATIONS

Fattal, D. et al., "A Silicon Lens for Integrated Free-Space Optics," Integrated Photonics Research, Silicon and Nanophotonics, Optical Society of America, 2011, 3 pages.
(Continued)

*Primary Examiner* — Kristina M Deherrera
(74) *Attorney, Agent, or Firm* — North Shore Associates (57) ABSTRACT

A high contrast grating optoelectronic apparatus includes an optoelectronic device at a front surface of a substrate. The optoelectronic device is to one or both of emit light and detect light through a back surface of the substrate opposite the front surface. A high contrast grating (HCG) lens is adjacent to and spaced apart from the back surface of the substrate by a spacer. The spacer includes one or both of a wafer-bonded substrate and a cavity. The HCG lens is to focus the light.

23 Claims, 5 Drawing Sheets

(51) Int. Cl.
  *H01S 5/183* (2006.01)
  *G02B 6/34* (2006.01)
  *H01L 31/0232* (2014.01)
  *H01S 5/026* (2006.01)
  *G02B 6/42* (2006.01)
  *G02B 27/09* (2006.01)
  *H01S 5/00* (2006.01)
  *H01S 5/10* (2006.01)

(52) U.S. Cl.
  CPC ......... *G02B 5/1857* (2013.01); *G02B 5/1866* (2013.01); *G02B 6/34* (2013.01); *G02B 6/4206* (2013.01); *G02B 27/0905* (2013.01); *H01L 31/02327* (2013.01); *H01S 5/0262* (2013.01); *H01S 5/18305* (2013.01); *H01S 5/18363* (2013.01); *H01S 5/18386* (2013.01); *H01S 5/18391* (2013.01); *H01S 5/0064* (2013.01); *H01S 5/02284* (2013.01); *H01S 5/105* (2013.01); *H01S 5/18388* (2013.01)

(58) Field of Classification Search
  USPC .................... 359/569; 385/31, 33–35, 88–93
  See application file for complete search history.

(56) References Cited

U.S. PATENT DOCUMENTS

| | | | |
|---|---|---|---|
| 5,428,635 A * | 6/1995 | Zhiglinsky | H01S 3/094034 372/102 |
| 6,829,286 B1 * | 12/2004 | Guilfoyle | G02B 6/34 372/108 |
| 6,856,460 B2 | 2/2005 | Coleman et al. | |
| 7,194,016 B2 | 3/2007 | Bullington et al. | |
| 8,059,690 B2 | 11/2011 | Chang-Hasnain et al. | |
| 8,189,643 B2 | 5/2012 | Chang-Hasnain et al. | |
| 8,340,483 B2 | 12/2012 | Lee et al. | |
| 8,488,646 B2 | 7/2013 | Chang-Hasnain et al. | |
| 8,526,471 B2 | 9/2013 | Chang-Hasnain et al. | |
| 8,861,060 B2 | 10/2014 | Puegner et al. | |
| 9,065,239 B2 * | 6/2015 | Joseph | H01S 5/02476 |
| 9,530,905 B2 | 12/2016 | Wang et al. | |
| 2002/0076128 A1 | 6/2002 | LoCascio et al. | |
| 2003/0117681 A1 | 6/2003 | Tayebati | |
| 2004/0136074 A1 | 7/2004 | Ford et al. | |
| 2008/0055698 A1 | 3/2008 | Yurlov et al. | |
| 2009/0290217 A1 * | 11/2009 | Hoose | G02B 5/1823 359/569 |
| 2011/0280269 A1 | 11/2011 | Chang-Hasnain et al. | |
| 2012/0027350 A1 | 2/2012 | Fu et al. | |
| 2012/0128019 A1 | 5/2012 | Chang-Hasnain et al. | |
| 2012/0281950 A1 | 11/2012 | Fattal et al. | |
| 2013/0028279 A1 | 1/2013 | Iakovlev et al. | |
| 2013/0051410 A1 | 2/2013 | Chang-Hasnain | |
| 2013/0051419 A1 | 2/2013 | Chang-Hasnain et al. | |
| 2013/0058370 A1 | 3/2013 | Chang-Hasnain et al. | |
| 2013/0209110 A1 | 8/2013 | Fattal et al. | |
| 2015/0010271 A1 | 1/2015 | Fattal et al. | |
| 2015/0160384 A1 | 6/2015 | Arbabi et al. | |

FOREIGN PATENT DOCUMENTS

| | | |
|---|---|---|
| WO | WO-2010068476 | 6/2010 |
| WO | WO-2011093895 | 8/2011 |
| WO | WO-2011136759 A1 | 11/2011 |
| WO | WO-2012144997 A1 | 10/2012 |
| WO | WO-2012149497 A2 | 11/2012 |
| WO | WO-2012155911 A1 | 11/2012 |
| WO | WO-2013005231 | 1/2013 |
| WO | WO-2013085535 A1 | 6/2013 |
| WO | WO-2013105959 A1 | 7/2013 |
| WO | WO-2014189507 | 11/2014 |
| WO | WO-2014204468 | 12/2014 |

OTHER PUBLICATIONS

Fattal, D. et al., "Flat Dielectric Grating Reflectors with Focusing Abilities," (Research Paper), Nature Photonics 4.7, May 2, 2010, pp. 466-470.

International Search Report & Written Opinion received in PCT Application No. PCT/US2013/067342, dated Jul. 24, 2014, 12 pages.

Extended European Search Report dated May 15, 2017 for EP applicaiton No. 13896275.8; pp. 10.

Fanglu Lu, "Planar High-Numerical-Aperture Low-Lose Focusing Reflectors and Lenses using Subwavelength High Contrast Gratings," Univ. California, Berkeley, Published May 27, 2010 Jun. 7, 2010 / vol. 18 No. 12/ Optics Express 12606, 9 pages.

Ansbaek, T. et al., "1060-nm Tunable Monolithic High Index Contrast Subwavelength Grating VCSEL," (Research Paper), Photonics Technology Letters, IEEE 25,4, Feb. 15, 2013, pp. 365-367.

Ansbaek, T., Vertical-cavity Surface-emitting Lasers for Medical Diagnosis, (Research Paper), Sep. 30, 2012.

Bisaillon, E. et al., Resonant Grating Based Fabry-Perot Cavity in AlGaAs/GaAs, (Research Paper), Jul. 6, 2006.

Chevallier, C. et al., "Optimized Si/SiO2 high contrast grating mirror design for mid-infrared wavelength range: robustness enhancement," (Research Paper), Nov. 18, 2011, pp. 1-13, available at http://arxiv.org/pdf/1111.4101.pdf.

Extended European Search Report. dated Nov. 28, 2016 for EP Application No. 13885204.1; pp. 9.

F. Lu, et al; "Planar high-numerical-aperture low-loss focusing reflectors and lenses using subwavelength high contrast gratings," Opt. Express, vol. 18, No. 12, pp. 12606-12614, (2010).

International Search Report & Written Opinion received in PCT Application No. PCT/US2013/042261, dated Feb. 26, 2014, 11 pages.

Karagodsky, Matrix Fabry—Perot resonance mechanism in high-contrast gratings, (Web Page), May 1, 2011. < http:www.opticsinfobase.org/ol/abstract.cfm?uri=ol-36-9/1704 >.

Lin, C-K et al., "High-Speed 985 nm Bottom-Emitting VCSEL Arrays for Chip-to-Chip Parallel Optical Interconnects," Selected Topics in Quantum Electronics, IEEE Journal of 13.5, 2007, pp. 1332-1339.

Weijian Yang et al., "High Speed, Ultra-compact Spectrometer Using High Contrast Grating Swept-wavelength Detector," 2013 IEEE Avionics, Fiber-Optics and Photonics Conference (AVFOP), Oct. 1-3, 2013, pp. 86-87.

Mathani, S. V., et al; "Notice of Allowance and Fee(s) Due"; cited in U.S. Appl. No. 15/106,850, dated Jun. 6, 2018; 13 pages.

* cited by examiner

"HIGH CONTRAST GRATING OPTOELECTRONICS"

CROSS-REFERENCE TO RELATED APPLICATIONS

N/A

STATEMENT REGARDING FEDERALLY SPONSORED RESEARCH OR DEVELOPMENT

N/A

BACKGROUND

Optoelectronic devices used in modern optoelectronic and photonic applications generally include both emitters that generate light such as lasers and light emitting diodes (LEDs) and photodetectors such as, but not limited to, photodiodes that receive and detect light. For example, a popular emitter used in many photonic systems is a vertical cavity surface emitting laser (VCSEL). VCSELs are relatively inexpensive to manufacture and utilize while being characterized by relatively high performance and reliability. Photodiodes based on p-n and p-i-n semiconductor junctions (e.g., PN photodiodes, PIN photodiodes, etc.) are also very common in modern photonic system and may provide high performance (e.g., high speed) with concomitant exceptionally good reliability at relatively low cost.

In many cases a lens is used and may even be required for proper operation of an optoelectronic device. For example, a lens may be used to focus or collimate light produced by a VCSEL. The focusing may facilitate interfacing the VCSEL with an optical fiber in an optical communication system, for example. Similarly, lenses may be employed to concentrate and focus light onto an active area of a photodetector to improve one or both of reception and detection of light.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide optoelectronics that employ a high contrast grating to focus light. In particular, a high contrast grating is configured as a lens to focus light that is one or both of emitted and detected by an optoelectronic device, according to various examples of the principles described herein. Further, according to various examples, the emitted or detected light focused by the high contrast grating lens is configured to pass through a substrate between the high contrast grating lens and the optoelectronic device. As such, the optoelectronic device is a 'back emitting' or 'back illuminated' optoelectronic device and the high contrast grating lens is located adjacent to the back surface of a substrate supporting the optoelectronic device. Moreover, the high contrast grating lens on or adjacent to a back side of the substrate facilitates integration with the optoelectronic device in the form of an optoelectronic apparatus. The optoelectronic apparatus including the integrated high contrast grating lens may enable flip-chip mounting of the optoelectronic apparatus, according to some examples.

Herein, a high contrast grating is defined as a sub-wavelength diffraction grating having a large refractive index contrast. In particular, the large refractive index contrast of the high contrast grating may be provided by grating elements (e.g., strips, bars, posts, etc.) having a relatively high refractive index that are substantially surrounded by a material or a medium having a relatively low refractive index, according to some examples. For example, the high contrast grating may include a plurality of spaced-apart bars (i.e., the grating elements) of a high refractive index or 'high index' material (e.g., silicon, aluminum gallium arsenide, etc.) surrounded by air, silicon dioxide, aluminum oxide or another relatively low refractive index or 'low index' material. In other examples, the low index material is only between the grating elements that include the high index material. In yet other examples, the low index material may be between the grating elements and also one of above or below the grating elements that include the high index material. According to various examples, one or both of the high index material and the low index material is selected to be substantially transparent at an operational wavelength of the high contrast grating.

In some examples, the high contrast grating includes the same low index material or medium between each of the high index grating elements as well as above and below the high index grating elements. In other examples, a material between the high index grating elements includes a first low index material, while a second low index material is one or both of above and below the high index grating elements. In yet other examples, a material above the high index grating elements is the second low index material and a third low index material is below the high index grating elements.

According to various examples, a difference between the refractive index of the high index material and the refractive index of the low index material is determined by a particular application or use of the high contrast grating including, but not limited to, an operational wavelength of the high contrast grating. In some examples, the relatively high refractive index may be about 2 times or more greater than the relatively low refractive index. For example, the grating elements may including a material having a refractive index that is greater than about 2.0 and the material or medium surrounding the grating elements may have a refractive index of about 1.0. In another example, the high index material may have a refractive index of about 3.5 (e.g., silicon, germanium, etc.) and the low index material may have a refractive index of between about 1.0 and about 2.0 (e.g., silicon dioxide, germanium dioxide).

According to some examples, the high contrast grating is substantially planar and may be characterized as either a one-dimensional (1-D) grating structure or a two-dimensional (2-D) grating structure. In particular, the high contrast grating may be implemented in a substantially planar layer as a 1-D or 2-D array of high contrast grating elements. For example, a 1-D high contrast grating may include a plurality of substantially parallel bars or strips arranged in a planar layer. In another example, a quasi-2D high contrast grating may include a plurality of curved bars or strips, or bars whose width is varied along the bar. In yet another example, a plurality of spaced-apart rectangular, circular or elliptical, etc., elements arranged in a layer as a 2-D array may provide a 2-D high contrast grating. According to various examples, the high contrast grating may be either a periodic grating or a substantially non-periodic (i.e., aperiodic) grating.

Figure 1:
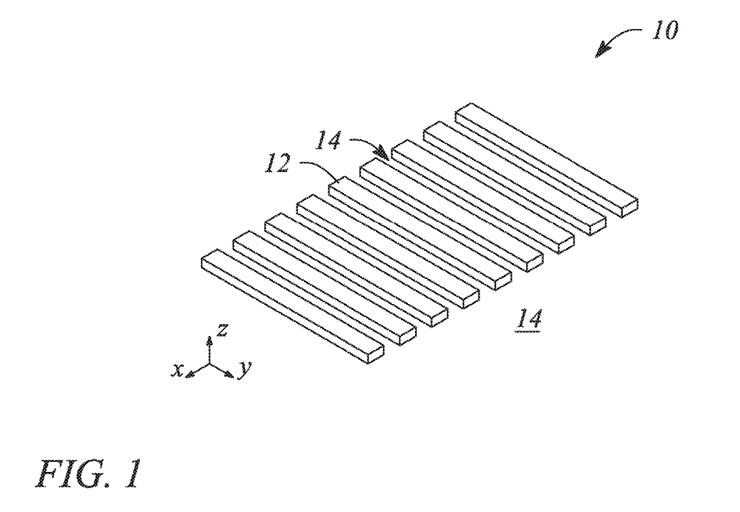
FIG. 1 illustrates a perspective view of a high contrast grating, according to an example consistent with the principles described herein.

FIG. 1 illustrates a perspective view of a high contrast grating 10, according to an example consistent with the principles described herein. In particular, the high contrast grating 10 illustrated in FIG. 1 is a 1-D high contrast grating 10. The high contrast grating 10 includes a plurality of substantially parallel, rectangular bars 12 arranged in a planar layer (e.g., a layer in an x-y plane, as illustrated). A center-to-center spacing between the rectangular bars 12 is less than a wavelength at which the high contrast grating 10 is to be operated or used (i.e., an operational wavelength). The rectangular bars 12 include a material having a high refractive index and are surrounded by a medium 14 having a low refractive index. For example, the rectangular bars 12 may include silicon, while the medium 14 may include silicon dioxide or air, as illustrated.

Herein, a high contrast grating (HCG) lens is defined as a high contrast grating configured to function as a lens to focus or collimate light. Further, by definition herein, the HCG lens includes a high contrast grating having a grating pitch small enough to substantially suppress all but a zeroth ($0^{th}$) order diffraction mode at an operational wavelength of the HCG lens. According to various examples, all higher order diffraction modes are below a cutoff at the operational wavelength of the HCG lens. In particular, by definition herein, the HCG lens is a non-periodic, high contrast grating that supports only the zeroth order diffraction mode and that is configured to provide a predetermined phase front modification to the light passing through the HCG lens, where the phase front modification is consistent with that of a lens (e.g., the HCG lens acts to bend and focus light). For example, the phase front modification may be consistent with that provided by a refractive lens.

In some examples, one or both of a spacing between grating elements and a width or size of the grating elements of the HCG lens is varied as a function of distance across or along a grating structure of the HCG lens to provide the predetermined phase front modification. In some examples, the HCG lens may be a 1-D lens in which the pre-determined phase front modification is provided in only one direction (e.g., an x-direction substantially parallel to a plane of the HCG lens). In other examples, the HCG lens is a 2-D lens configured to provide the predetermined phase front modification in two substantially orthogonal directions (e.g., an x-direction and ay-direction). According to various examples, the predetermined phase front modification provided by the HCG lens may correspond to or be consistent with a phase front modification provided by substantially any arbitrary lens (e.g., any refractive lens design or shape). For example, the predetermined phase front modification of or provided by the HCG lens may be consistent with that of a convex lens (e.g., refractive plano-convex, refractive biconvex, etc.). In some examples, the HCG lens may implement a collimating lens. In some examples, the HCG lens may implement an off-axis or tilted beam lens.

Further, as used herein, the article 'a' is intended to have its ordinary meaning in the patent arts, namely 'one or more'. For example, 'a lens' means one or more lenses and as such 'the lens' means 'the lens(es)' herein. Also, any reference herein to 'top', 'bottom', 'upper', 'lower', 'up', 'down', 'front', 'back', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Further, herein the term 'substantially' as used herein means a majority, or almost all, or all, or an amount with a range of about 51% to about 100%, for example. Moreover, examples herein are intended to be illustrative only and are presented for discussion purposes and not by way of limitation.

Figure 2:
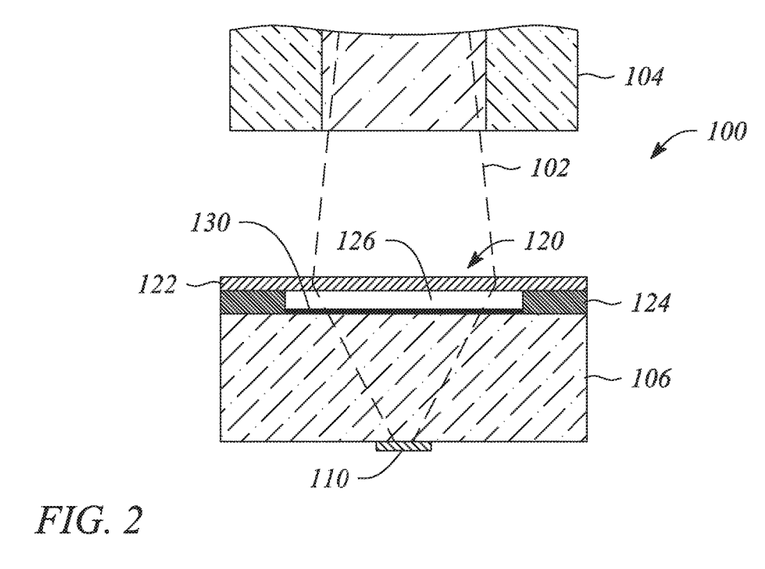
FIG. 2 illustrates a cross sectional view of a high contrast grating optoelectronic apparatus, according to an example of the principles described herein.

FIG. 2 illustrates a cross sectional view of a high contrast grating (HCG) optoelectronic apparatus 100, according to an example of the principles described herein. According to some examples, the HCG optoelectronic apparatus 100 is configured to emit a beam of light 102. The beam of light 102 may be focused. For example, a focused beam of light 102 may be emitted either as a substantially collimated light beam or as a light beam having a focal point and a spot size at a predetermined distance from the HCG optoelectronic apparatus 100. The focal point may correspond to an end of an optical fiber 104, for example, as illustrated in FIG. 2. In other examples, the HCG optoelectronic apparatus 100 may be configured to focus light 102 incident on the HCG optoelectronic apparatus 100. Further, the HCG optoelectronic apparatus 100 may be configured to detect the focused incident light 102. In yet other examples, the HCG optoelectronic apparatus 100 may be configured to both emit and detect light 102 (e.g., may include both alight source and a photodetector). In still other examples (not illustrated in FIG. 2), the HCG optoelectronic apparatus 100 may be configured to both focus the light beam 102 and tilt the light beam 102 at a predetermined angle. In particular, the HCG optoelectronic apparatus 100 may one or both of emit in and detect light from an off-axis direction (not illustrated). In FIG. 2, the beam of light 102 is illustrated using dashed lines.

According to various examples, a substrate 106 of the HCG optoelectronic apparatus 100 is substantially transparent to the light 102 and may be configured for attachment using so-called 'flip-chip' attachment to a carrier or motherboard adjacent to a first or 'front' side or surface of the substrate 106. In particular, the substrate 106 is substantially transparent to light 102 at an operational wavelength of the optoelectronic apparatus 100, according to various examples. Further, to support the flip-chip attachment, the high contrast grating based optoelectronic apparatus 100 is configured to one or both of emit light 102 and receive incident light 102 through a second or 'back' side or surface of the substrate 106 opposite the front surface, according to various examples. The light 102 may readily pass through the substantially transparent substrate 106 with relatively little optical loss at an operational wavelength of the optoelectronic apparatus 100, according to various examples. Electrical contacts or pads and other circuit elements (not illustrated in FIG. 2) used to interconnect and power the HCG optoelectronic apparatus 100 may be provided on the front surface of the HCG optoelectronic apparatus 100 to facilitate flip-chip attachment, according to various examples.

The HCG optoelectronic apparatus 100 includes an optoelectronic device 110. According to various examples, the optoelectronic device 110 is at the front surface of the substrate 106 of the HCG optoelectronic apparatus 100. In some examples, the optoelectronic device 110 is configured to emit light 102 through the substrate 106 and out the back surface. In some examples, the optoelectronics device 110 is configured to detect light 102 through the substrate from the back surface. In some examples, the optoelectronic device 110 is configured to both emit light 102 and detect light 102 through the back surface. In particular, the optoelectronic device 110 may include an optoelectronic layer or layers at the front surface of the substrate 106, the optoelectronic layers being configured to one or both of emit light 102 and detect light 102, according to various examples.

According to some examples, the light 102 that is emitted or detected may have an operational wavelength between about 650 nanometers (nm) and about 1600 nm or more. For example, the light 102 may have a wavelength between about 850 nm and about 980 nm. In another example, the light 102 may have a wavelength between about 980 nm and about 1100 nm. In yet another example, the wavelength of the light 102 may be between about 1500 nm and about 1600 nm. In other examples, light 102 at another operational wavelength other than between about 650 nm and about 1600 nm may be one or both of emitted and detected by the HCG optoelectronic apparatus 100.

In some examples, the optoelectronic device 110 is or includes a back emitting vertical cavity surface emitting laser (BE-VCSEL) 110. For example, the BE-VCSEL 110 may be provided (e.g., fabricated) in the front surface of the substrate 106 as a plurality of optoelectronic layers. Optoelectronic layers of the plurality may include, but are not limited to, various distributed Bragg reflector (DBR) layers as well as layers that make up a heterojunction (e.g., quantum well) of the BE-VCSEL. The various optoelectronic layers may be epitaxially grown, deposited on, attached or otherwise provided within the substrate 106 at or adjacent to the front surface, according to various examples.

According to some examples, the substrate 106 may be a BE-VCSEL substrate that includes a semiconductor material such as, but not limited to, gallium arsenide (GaAs) and indium phosphide (InP). For example, in a BE-VCSEL based on GaAs, the DBR optoelectronic layers may include alternating layers of GaAs and aluminum gallium arsenide (AlGaAs), while a light-emitting region (e.g., quantum well and confinement layers) of the optoelectronic layers may include GaAs, AlGaAs and indium gallium arsenide (InGaAs), for example. An InP based BE-VCSEL may employ an InP substrate 106 with alternating aluminum gallium indium arsenide (AlGaInAs) and InP layers acting as the DBR optoelectronic layers, for example. In other examples, the substrate 106 may include a dielectric material such as, but limited to, glass.

In other examples, the BE-VCSEL 110 may include a VCSEL chip or wafer that is attached to the front surface of the substrate 106. The VCSEL chip or wafer containing the plurality of optoelectronic layers may be attached to the front surface by wafer bonding, for example. The attached VCSEL is configured to emit light 102 through the substrate 106 toward the back surface and thus is a BE-VCSEL 110 when attached, according to various examples. For example, the VCSEL chip or wafer may include, but is not limited to, a semiconductor material such as GaAs, InP, AlGaAs and InGaAs. The VCSEL chip or wafer may be wafer bonded to another material to act as the substrate 106. For example, materials other than GaAs and InP such as, but not limited to, silicon (Si) and glass may be used as the substrate 106 onto which the VCSEL chip or wafer is wafer bonded. In some examples, the substrate 106 and the VCSEL chip or wafer may include substantially the same material. In yet other examples, the optoelectronic device 110 may be another light emitting optoelectronic device 110 including, but not limited to, a light emitting diode (LED) that is configured to emit light 102 toward the back surface of the substrate 106.

According to some examples, the optoelectronic device 110 includes a photodetector 110. For example, the photodetector 110 may be a photodiode 110. The photodiode 110 may be configured to be illuminated through the substrate 106 from the back surface. Further, the illuminated photodiode 110 may be configured to detect light 102 that passes through the substrate 106 from the back surface to the front surface, for example. According to various examples, the photodiode 110 may be provided in or on the front surface of the substrate 106 (e.g., as deposited layers on or variously doped regions in the substrate 106). In other examples, the photodetector 110 may be any of a variety of other devices that may be employed to detect light 102 including, but not limited to, active pixel sensors, charge coupled devices, photoconductor, phototransistors and photovoltaic cells.

Referring again to FIG. 2, the HCG optoelectronic apparatus 100 further includes a high contrast grating (HCG) lens 120. The HCG lens 120 is adjacent to the back surface of the substrate 106 and is configured to focus the light 102. In particular, when the optoelectronic device 110 is configured to emit light 102, the HCG lens 120 is configured to focus the emitted light 102. For example, when the optoelectronic device 110 is a BE-VCSEL 110, the light 102 to be focused by the HCG lens 120 is a laser emission of the BE-VCSEL 110. The HCG lens 120 may collimate the laser emission of the BE-VCSEL 110, in some examples. In other examples, the HCG lens 120 may focus the laser emission of the BE-VCSEL 110 on an aperture (e.g., of an optical fiber). On the other hand, when the optoelectronic device 110 is configured to detect light 102 (e.g., a photodiode), the HCG lens 120 may be configured to focus light 102 onto an active region of the optoelectronic device 110. For example, the HCG lens 120 may receive light 102 from an aperture (e.g., of an optical fiber) and focus the light 102 on the photodiode active region. In some examples, the HCG lens 120 is a one-dimensional (1-D) lens. In other examples, the HCG lens 120 is a two-dimensional (2-D) lens.

As illustrated in FIG. 2, the HCG lens 120 may include an HCG layer 122 adjacent to and spaced apart from the back surface of the substrate 106. In various examples, the HCG layer 122 may be a suspended layer of material such as, but not limited to, Si, GaAs, InP and other semiconductor materials. For example, the HCG layer 122 may include, but is not limited to, a suspended layer of amorphous Si, poly-Si, or silicon carbide (SiC).

According to various examples, the HCG layer 122 may be suspended or spaced apart from the back surface of the substrate 106 by a spacer layer or spacer 124. The spacer layer or spacer 124 serves as a standoff to separate the HCG layer 122 from the substrate back surface. Further, the spacer or spacer layer 124 may include a cavity 126 between the HCG lens 120 and the substrate 106 (e.g., an air-filled cavity). For example, the HCG layer 122 including amorphous Si may be spaced apart from the substrate back surface by the spacer 124 that includes silicon dioxide ($SiO_2$). The $SiO_2$ spacer 124 may be formed by a layer of $SiO_2$ acting as a sacrificial layer using microelectromechanical systems (MEMS) fabrication techniques to suspend a portion of the HCG layer 122 that includes the HCG lens 120, for example. In particular, the cavity 126 may be provided by removal of the sacrificial layer below HCG layer 122 to suspend the portion that includes the HCG lens 120.

In some examples, the HCG lens 120 is suspended in air and the cavity 126 is an air-filled cavity 126. In particular, air may surround the HCG lens 120 and fill in between the high index grating elements thereof. Further, air may substantially fill the cavity 126 between the HCG layer 122 and the back surface of the substrate 106. FIG. 2 illustrates the cavity 126 between the HCG lens 120 of the HCG layer 122 and the substrate back surface surrounded and filled by air. The air-filled cavity 126 may have a refractive index of about 1.0.

In other examples (not illustrated), another material may fill or at least partially fill the cavity 126 (e.g., see FIG. 3 described below). For example, the cavity 126 may be filled by another low refractive index fluid other than air or even a vacuum. In another example, the cavity 126 may be filled or partially filled by an encapsulating material. In particular, the HCG lens 120 may be encapsulated by the encapsulating material or 'encapsulant.' The encapsulating material may protect the HCG lens 120, according to some examples. For example, the encapsulating material may protect the HCG lens 120 from processing (e.g., etch, etc.) that occurs after the fabrication of the HCG lens 120 or an operational environment. The encapsulating material may include, but is not limited to, silicon nitride or a similar material having a low refractive index relative to a material of the HCG lens 120. In other examples, the encapsulating material may be a liquid polymer or glass material that is, for example, spin coated onto the surface. In yet other examples, the encapsulating material may include a polymer or glass film laminated onto the HCG layer 122 to cover the HCG lens 120.

Figure 3:
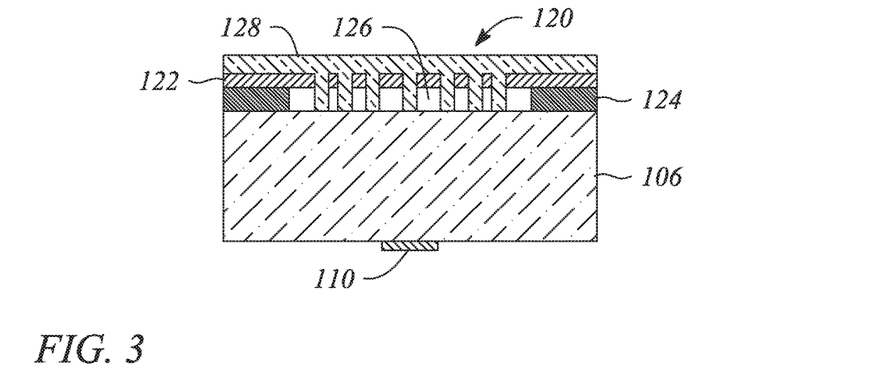
FIG. 3 illustrates a cross sectional view of a high contrast grating optoelectronic apparatus, according to another example of the principles described herein.

FIG. 3 illustrates a cross sectional view of a high contrast grating (HCG) optoelectronic apparatus 100, according to another example of the principles described herein. As illustrated in FIG. 3, the HCG lens 120 is encapsulated by an encapsulating material 128 (e.g., silicon nitride). The encapsulating material 128 substantially covers and protects the HCG lens 120. Further, the encapsulating material 128 partially fills the cavity 126 between the HCG lens 120 and the substrate 106, as illustrated. An anisotropic deposition technique (e.g., a directional deposition) may be employed to deposit the encapsulating material 128 to partially fill the cavity 126. In other examples (not illustrated), the cavity 126 may be substantially filled by the encapsulating material 128 using, for example, an isotropic deposition technique. In yet other examples (not illustrated), the encapsulating material may form a cover layer on top of the HCG lens 120.

Referring again to FIG. 2, the HCG optoelectronic apparatus 100 further includes an antireflection coating 130, according to some examples. In particular, the antireflection coating 130 may be located on the substrate 106 between the HCG lens 120 and the back surface of the substrate 106. The antireflection coating 130 is an optical layer configured to reduce reflection of light 102 at the substrate back surface, by definition herein. The antireflective coating 130 may be deposited, for example, by vapor deposition, between the spacer 124 and substrate 106. In other examples, the antireflective coating 130 may be deposited by vapor deposition through openings of the HCG lens 120, according to some examples. For example, one or more layers that include a combination of silicon nitride and silicon dioxide (e.g., in varying ratios) may be used as an antireflection coating 130 on a substrate 106 that includes silicon. FIG. 2 illustrates the antireflective coating 130 on the back surface of the substrate 106.

Figure 4:
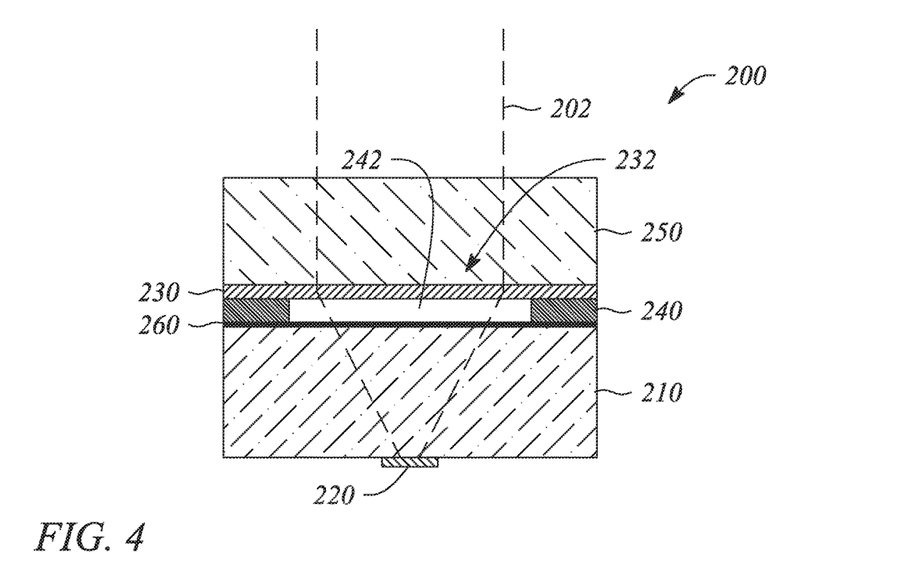
FIG. 4 illustrates a cross sectional view of an optoelectronic apparatus employing a high contrast grating, according to an example consistent with the principles described herein.

FIG. 4 illustrates across sectional view of an optoelectronic apparatus 200 employing a high contrast grating, according to an example consistent with the principles described herein. As illustrated, the optoelectronic apparatus 200 includes a transparent substrate 210 having a first surface and a second surface opposite the first surface. The transparent substrate 210 is configured to transmit light 202. The transmitted light 202 may be at or include an operational wavelength of the optoelectronic apparatus 200, for example. In particular, the transparent substrate 210 may be substantially transparent to the light 202 at the operational wavelength. In some examples, the transparent substrate 210 may be substantially similar to the substrate 106 described above with respect to the HCG optoelectronic apparatus 100. In FIG. 4, the transmitted light 202 is illustrated using dashed lines.

The optoelectronic apparatus 200 further includes an optoelectronic layer 220 at the first surface of the transparent substrate 210. In various examples, the optoelectronic layer 220 is configured to one or both of emit the light 202 and detect the light 202. In particular, the optoelectronic layer 220 may provide optoelectronic functionality that is substantially similar to the functionality of the optoelectronic device 110 of the HCG optoelectronic apparatus 100, described above. For example, the optoelectronic layer 220 may include one or both of a vertical cavity surface emitting laser (VCSEL) and a photodiode. The VCSEL may be configured to emit light in a direction toward the second surface of the substrate 210, while the photodiode may be configured to be illuminated by and detect light from the substrate second surface, for example. As illustrated in FIG. 4, the optoelectronic layer 220 covers only a portion of the first surface of the transparent substrate 210. However, in other examples (not illustrated), the optoelectronic layer 220 may cover substantially all of the substrate first surface.

The optoelectronic apparatus 200 further includes a high contrast grating (HCG) layer 230. The HCG layer 230 is adjacent to and spaced apart from the second surface of the transparent substrate 210, according to various examples. Further, according to various examples, the HCG layer 230 is configured to provide an HCG lens 232 to focus the light 202. When the optoelectronic layer 220 includes a VCSEL, the HCG lens 232 may be configured to focus the light 202 emitted by the VCSEL. When the optoelectronic layer 220 includes a photodiode, the HCG lens 232 may be configured to focus the light 202 onto the photodiode.

In various examples, the optoelectronic apparatus 200 further includes a spacer layer 240 between the HCG layer 230 and the transparent substrate 210. In some examples, the spacer layer 240 is configured to suspend the HCG lens 232 of the HCG layer 230 above and away from the second surface of the transparent substrate 210. In some examples, the spacer layer 240 may be substantially similar to the spacer layer 124, described above with respect to the HCG optoelectronic apparatus 100. In particular, the spacer layer 240 may serve as a standoff between the HCG layer 230 and the second surface of the transparent substrate 210. In particular, the spacer layer 240 may provide a cavity 242 between the HCG lens 232 and the transparent substrate 210, according to some examples.

As illustrated in FIG. 4, the optoelectronic apparatus 200 further includes a wafer-bonded support layer or substrate 250. The wafer-bonded support substrate 250 is configured to support the HCG layer 230 adjacent to the substrate second surface. For example, the HCG layer 230 may be provided on the wafer-bonded support substrate 250. The wafer-bonded support substrate 250 may then be wafer bonded onto the transparent substrate 210 to position the HCG layer 230 adjacent to the substrate second surface. In particular, as illustrated in FIG. 4, the wafer-bonded support substrate 250 with the HCG layer 230 supported on a surface thereof is adjacent to the second surface of the transparent substrate 210 which includes the spacer layer 240. Further, as illustrated, the HCG layer 230 is spaced apart from the transparent substrate second surface by the spacer layer 240.

According to various examples, the wafer-bonded support substrate 250 may include substantially any material or combination of materials that may be used to support the HCG layer 230 and further that may be wafer bonded to the transparent substrate 210. For example, the wafer-bonded support substrate 250 may include glass or a similar optically transparent material. In other examples, the wafer-bonded support substrate 250 may include a semiconductor material such as, but not limited to, silicon (Si), gallium arsenide (GaAs) and indium phosphide (InP). The wafer-bonded support substrate 250 may have a coefficient of thermal expansion (CTE) that is matched to a CTE of the transparent substrate 210, according to some examples. For example, a glass material that is CTE matched to a material of the transparent substrate 210 may be employed for the wafer-bonded support substrate 250. In some examples, the wafer-bonded support substrate 250 and the transparent substrate 210 may include the same material.

Also illustrated in FIG. 4 is an antireflection coating 260 on the second surface of the transparent substrate 210. As illustrated, the antireflection coating 260 covers substantially the entire second surface. In some examples, the antireflection coating 260 may be substantially similar to the antireflection coating 130 described above with respect to the HCG optoelectronic apparatus 100. In particular, the antireflection coating 260 may be substantially confined to a portion of the substrate second surface located below the HCG lens 232 of the HCG layer 230, according to some examples.

In some examples (not illustrated), the HCG layer 230 may be suspended away or spaced apart from the wafer-bonded support substrate 250. According to various examples, the HCG layer 230 may be spaced apart from the wafer-bonded support substrate 250 either instead of or in addition to the HCG layer 230 being spaced apart from the transparent substrate second surface. For example, the spacer layer 240 may be located between the wafer-bonded support substrate 250 and the HCG layer 230, instead of between the HCG layer 230 and the second surface of the transparent substrate 210. In other examples, the HCG layer 230 may be spaced apart from the wafer-bonded support substrate 250 by another spacer or spacer layer. The other spacer layer may be provided in addition to the spacer layer 240 illustrated in FIG. 4, for example.

Figure 5:
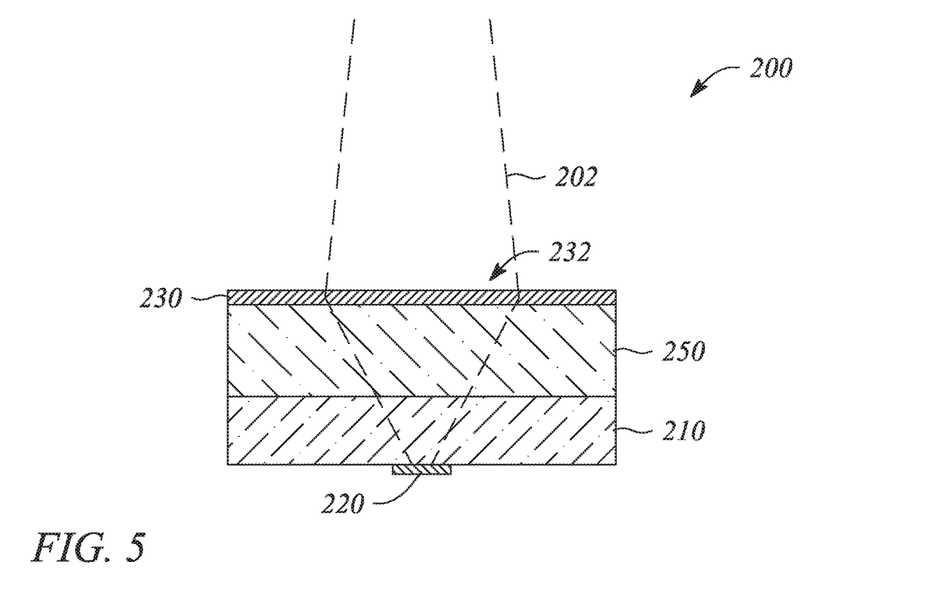
FIG. 5 illustrates a cross sectional view of an optoelectronic apparatus employing a high contrast grating, according to another example consistent with the principles described herein.

FIG. 5 illustrates a cross sectional view of an optoelectronic apparatus 200 employing a high contrast grating, according to another example consistent with the principles described herein. In particular, FIG. 5 illustrates the optoelectronic apparatus 200 including the transparent substrate 210, the optoelectronic layer 220 at a first surface of the transparent substrate 210, the HCG layer 230 with the HCG lens 232, and a wafer-bonded support substrate 250 configured to support the HCG layer 230 adjacent to the substrate second surface. As in FIG. 4, the optoelectronic apparatus 200 is configured to provide one or both of emission and detection of light 202, the light being transmitted through the transparent substrate 210. Further, the optoelectronic layer 220 is configured to one or both emit and detect the light 202, while the HCG layer 230 with the HCG lens 232 is configured to focus the light 202. In FIG. 5, the light 202 is also illustrated using dashed lines. However, unlike the example illustrated in FIG. 4, the wafer-bonded support substrate 250 in FIG. 5 is between the second surface of the substrate 210 and the HCG layer 230. As such, the spacer or spacer layer between HCG layer 230 and the second surface of the transparent substrate 210 includes the wafer-bonded support substrate 250 illustrated in FIG. 5.

In particular, as illustrated in FIG. 5, the HCG layer 230 is supported on a surface of the wafer-bonded support substrate 250 opposite to a surface that is wafer bonded to the transparent substrate 210 at the substrate second surface. The wafer-bonded support substrate 250 spaces apart the HCG layer 230 and the transparent substrate second surface, as illustrated. In some examples (not illustrated), an antireflection coating may be provided between the transparent substrate 210 and the wafer-bonded support substrate 250. In other examples (not illustrated), a hole, cavity, or depression may be provided (e.g., by etching) in one or both of the transparent substrate 210 and the wafer-bonded support substrate 250 and the HCG layer 230 may be suspended above the hole, cavity or depression.

In some examples, the transparent substrate 210 may be thinned relative to an original thickness of the transparent substrate 210. Thinning may be employed to provide a distance between the optoelectronic layer 220 and the HCG layer 230 consistent with proper operation of the HCG lens 232 with respect to the beam of light 202, for example. In particular, thinning may be employed to establish a predetermined distance between the HCG lens 232 and the optoelectronic layer 220 consistent with a focal distance of the HCG lens 232, according to some examples.

In some examples consistent with the principles described herein, a method of fabricating high contrast grating based optoelectronics is provided. In some examples, the method of fabricating may be used to realize the high contrast grating optoelectronic apparatus 100, described above. In other examples, the optoelectronic apparatus 200 described above with reference to either FIG. 4 or FIG. 5 may be fabricated according to the method of fabricating.

Figure 6:
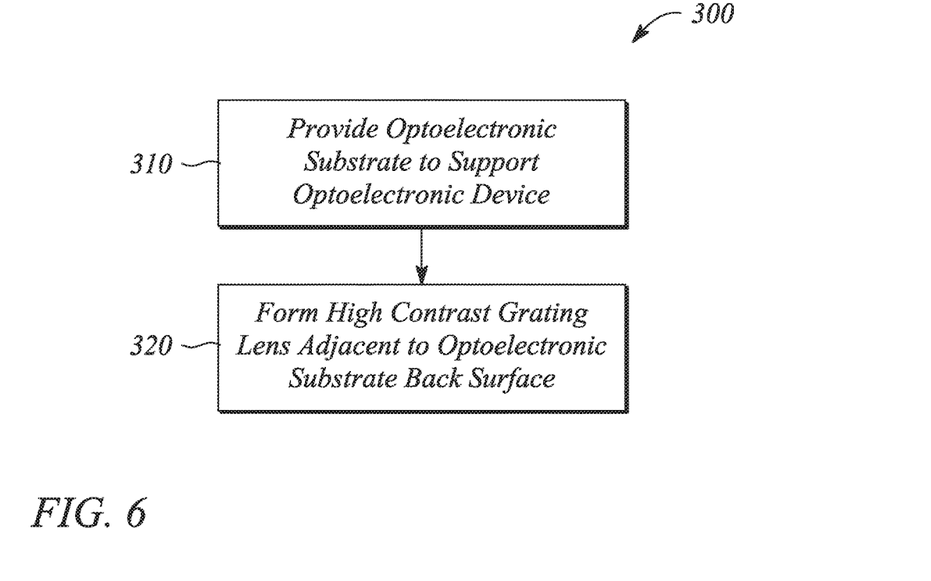
FIG. 6 illustrates a flow chart of a method of fabricating high contrast grating based optoelectronics, according to an example consistent with the principles described herein.

FIG. 6 illustrates a flow chart of a method 300 of fabricating high contrast grating based optoelectronics, according to an example consistent with the principles described herein. The method 300 includes providing 310 an optoelectronic substrate. The provided 310 optoelectronic substrate is configured to support an optoelectronic device on a first or 'front' surface. Further, the provided 310 optoelectronic substrate is configured to transmit light between the front surface and a second or 'back' surface of the optoelectronic substrate. In some examples, the provided 310 optoelectronic substrate is substantially similar to the substrate 106 described above with respect to the HCG optoelectronic apparatus 100. Further in some examples, the provided 310 optoelectronic substrate includes the optoelectronic device.

In particular, in some examples, the optoelectronic substrate includes a light emitting optoelectronic device such as, but not limited to, a back emitting vertical cavity surface emitting laser (BE-VCSEL) and a light emitting diode (LED). The BE-VCSEL or the LED is configured to emit light toward the back surface of the optoelectronic substrate. In some examples, the optoelectronic substrate includes a photodetector instead of or in addition to the light emitting optoelectronic device. The photodetector may include, but is not limited to, a photodiode, for example. The photodetector is configured to detect light illuminating the back surface of the optoelectronic substrate. The light emitting optoelectronic device and the photodetector may be pre-formed in the provided 310 optoelectronic substrate, for example.

In other examples, providing 310 the optoelectronic substrate may include forming or fabricating the optoelectronic device in the front surface of the optoelectronic substrate. Forming the optoelectronic device may include depositing or otherwise establishing one or more layers of materials on the front surface to form the optoelectronic device. According to various examples, the material layers of the optoelectronic device may be formed using semiconductor fabrication methods. For example, the material layers may be epitaxially grown or deposited semiconductor layers that form portions of the optoelectronic device such as, but not limited to, a distributed Bragg reflector (DBR), a semiconductor junction (e.g., a p-n junction or a p-i-n junction), and a quantum well. Forming the optoelectronic device may also include, but is not limited to, selectively doping portions of the optoelectronic substrate with a dopant (e.g., to establish a semiconductor junction within a material of the optoelectronic substrate), for example.

The method 300 of fabricating high contrast grating based optoelectronics further includes forming 320 a high contrast grating (HCG) lens. The HCG lens is formed 320 in an HCG layer, for example. In various examples, the HCG lens is formed 320 adjacent to and spaced apart from the optoelectronic substrate back surface. Further, the HCG lens is configured to focus the light transmitted between the front surface and back surface of the optoelectronic substrate. According to some examples, the formed 320 HCG lens is substantially similar to the HCG lens 120 and the HCG layer 122 described above with respect to the HCG optoelectronic apparatus 100.

In particular, in some examples, the formed 320 HCG lens is adjacent to and spaced apart from the back surface of the provided 310 optoelectronic substrate by a spacing layer or spacer. According to various examples, the spacer includes one or both of a cavity and a wafer-bonded substrate. For example, the cavity may be an air-filled cavity in a spacer material. When the spacer includes the wafer-bonded substrate, the HCG lens may be formed 320 on a wafer-bonded support substrate. The wafer-bonded support substrate may then be wafer bonded to the back surface of the provided 310 optoelectronic substrate after forming 320 the HCG lens. In other examples, the HCG lens 320 may be formed after the wafer-bonded support substrate is wafer bonded to the back surface of the provided 310 optoelectronic substrate.

Figure 7:
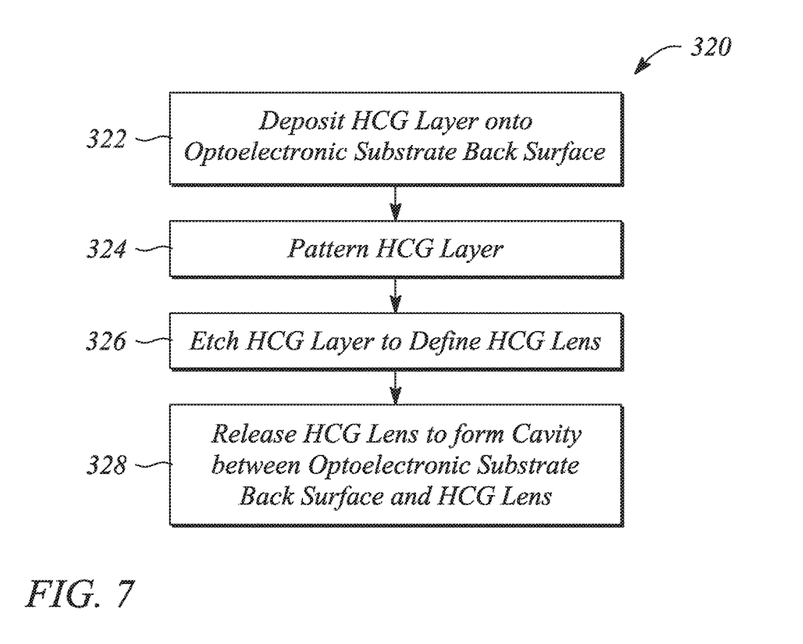
FIG. 7 illustrates a flow chart of forming a high contrast grating lens of FIG. 6, according to an example consistent with the principles described herein.

FIG. 7 illustrates a flow chart of a process of forming 320 a high contrast grating (HCG) lens of FIG. 6, according to an example consistent with the principles described herein. As illustrated in FIG. 7, forming 320 the HCG lens includes depositing 322 an HCG layer onto the back surface of the optoelectronic substrate. The HCG layer may include a semiconductor material such as, but not limited to, amorphous silicon (Si), for example. In some examples, the HCG layer is deposited over a sacrificial spacer layer. The sacrificial spacer layer may include, but is not limited to, silicon dioxide ($SiO_2$), for example. Forming 320 the HCG lens further includes patterning 324 the HCG layer. Patterning 324 may be provided by a variety of methods including, but not limited to, photolithography and imprint lithography. Forming 320 the HCG lens further includes etching 326 the patterned HCG layer to define the HCG lens. Etching 326 may be accomplished using either a dry etch or a wet etch, according to various examples. For example, a dry etch such as, but not limited to, plasma etching and reactive ion etching (RIE) may be employed in etching 326 the HCG layer. An HCG layer including Si may be wet etched using a potassium hydroxide (KOH) solution, for example, during etching 326 the HCG layer.

Further, forming 320 the HCG lens includes releasing 328 the HCG lens. In some examples, releasing 328 the HCG lens is configured to form the cavity between the optoelectronic substrate back surface and the HCG lens. Releasing 328 the HCG lens may include selectively etching a portion of the sacrificial spacer layer in a region between the HCG lens and the optoelectronic substrate back surface. Selective etching of the sacrificial spacer layer that includes $SiO_2$ may be accomplished using an etching solution including hydrofluoric (HF) acid, for example. In other examples, another method of releasing 328 the HCG lens including, but not limited to, vapor HF etching may be employed. According to various examples, only a portion of the sacrificial spacer layer behind or under the HCG lens is removed by selective etching when releasing 328 the HCG lens.

Figure 8A:
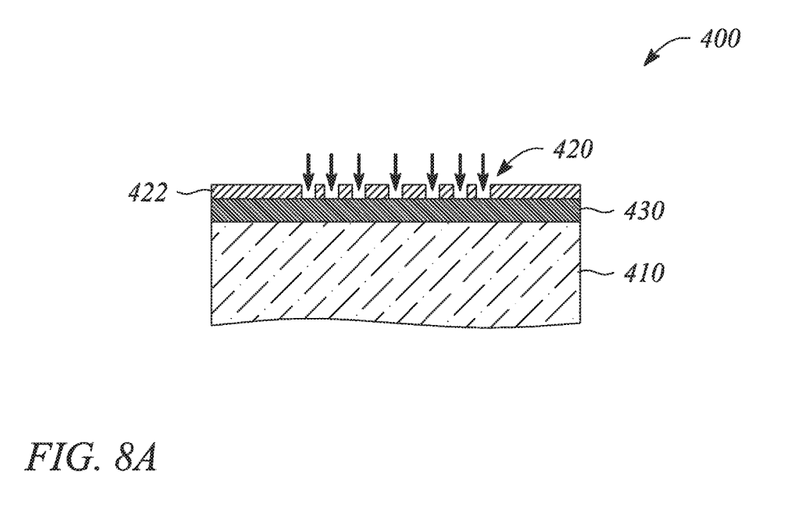
FIG. 8A illustrates a cross sectional view of high contrast grating based optoelectronics before releasing a high contrast grating lens, according to an example consistent with the principles described herein.

FIG. 8A illustrates across sectional view of high contrast grating (HCG) based (HCG-based) optoelectronics 400 before releasing 328 the HCG lens, according to an example consistent with the principles described herein. In particular, FIG. 8A illustrates an optoelectronic substrate 410 with an HCG lens 420 in an HCG layer 422. The HCG lens 420 is spaced apart from a back surface of the optoelectronic substrate 410 by a sacrificial spacer layer 430. FIG. 8A may illustrate the HCG-based optoelectronics 400 after etching 326 the HCG layer but before releasing 328 the HCG lens, for example. As illustrated, a material of the sacrificial spacer layer 430 is present between the HCG lens 420 and the optoelectronics substrate back surface. The vertical arrows indicate action of an etchant to selectively remove the sacrificial spacer layer 430.

Figure 8B:
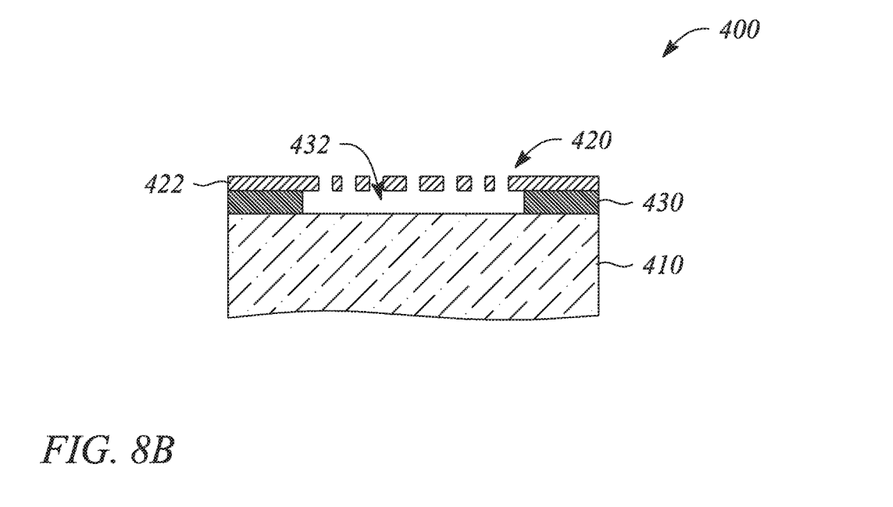
FIG. 8B illustrates a cross sectional view of the high contrast grating based optoelectronics of FIG. 8A after releasing the high contrast grating lens, according to an example consistent with the principles described herein.

FIG. 8B illustrates a cross sectional view of the HCG-based optoelectronics 400 of FIG. 8A after releasing 328 the HCG lens, according to an example consistent with the principles described herein. As illustrated in FIG. 8B, the material of the sacrificial spacer layer 430 between the HCG lens 420 and the back surface of the optoelectronics substrate 410 has been removed by etching during releasing 328 the HCG lens. Removal of the sacrificial spacer layer material 430 during releasing 328 the HCG lens creates a cavity 432, as illustrated, which may be air-filled or subsequently filled with a low refractive index material or fluid, for example.

In some examples (not illustrated), an antireflection coating may be applied to the back surface of the provided 310 optoelectronic substrate. For example, plasma enhanced chemical vapor deposition (PECVD) or atomic layer deposition (ALD) may be used to deposit the antireflection coating through openings in the HCG layer provided by the HCG lens. In some examples, the formed HCG lens is encapsulated by an encapsulating material. The encapsulating material may be applied by one or more of PECVD, ALD, sputtering, electron-beam evaporation, etc., for example. Encapsulating the HCG lens may be used to protect the HCG lens from subsequent fabrication processes and the environment. The HCG lens may be fully encapsulated or partially encapsulated, according to various examples. In particular, in some examples, the encapsulating material may partially fill a cavity between the HCG lens and the optoelectronics substrate back surface. In other examples, the cavity may be substantially filled by the encapsulating material.

Figure 9:
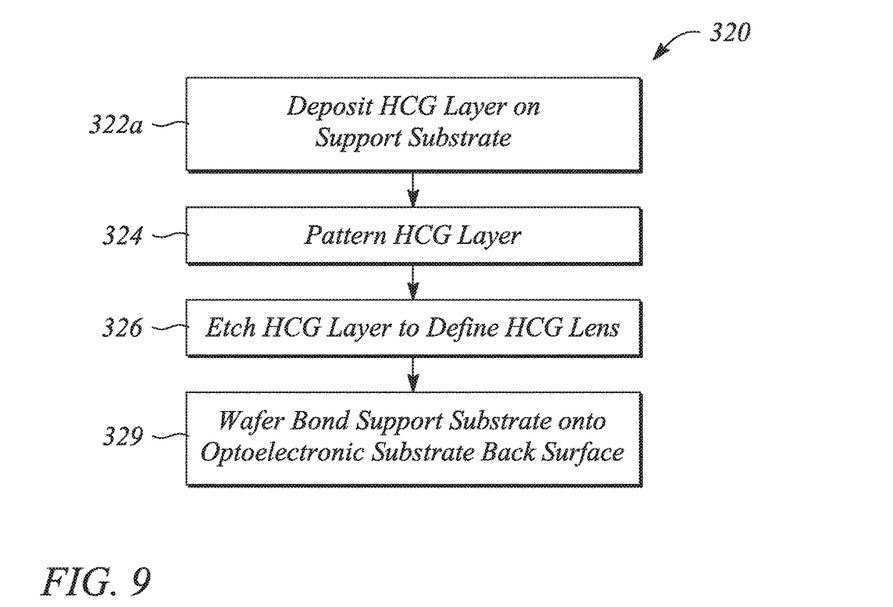
FIG. 9 illustrates a flow chart of forming a high contrast grating lens of FIG. 6, according to another example consistent with the principles described herein.

FIG. 9 illustrates a flow chart of a process of forming 320 a high contrast grating (HCG) lens of FIG. 6, according to another example consistent with the principles described herein. As illustrated in FIG. 9, forming 320 the HCG lens includes depositing 322a an HCG layer on a support substrate. The support substrate may include, but is not limited to, a semiconductor and glass. In some examples, the support substrate may be substantially similar to the wafer-bonded support substrate 250 described above with reference to FIG. 4 and the optoelectronic apparatus 200. Forming 320 the HCG lens further includes patterning 324 the HCG layer and etching 326 the patterned HCG layer to define the HCG lens. Patterning 324 the HCG layer may include, but is not limited to, defining a pattern in a resist using photolithography and defining a pattern in a resist using imprint lithography. Etching 326 the patterned HCG layer may be accomplished using either a dry etch or a wet etch, for example.

As illustrated in FIG. 9, forming 320 the HCG lens further includes wafer bonding 329 the support substrate with the defined HCG lens to the back surface of the provided 310 optoelectronic substrate. In some examples, the support substrate is wafer bonded 329 with the HCG layer facing toward the back surface of the optoelectronic substrate (e.g., as illustrated in FIG. 4). In these examples, a standoff or spacer is provided between the optoelectronic substrate back surface and the HCG lens on the support substrate. In particular, the standoff may be deposited or otherwise provided on the optoelectronic substrate back surface and then the support substrate with the HCG lens facing the optoelectronic substrate is wafer bonded to optoelectronic substrate back surface (e.g., on an exposed surface of the standoff). In some examples, the standoff provides a cavity (e.g., an air-filled cavity) between the optoelectronic substrate back surface and the HCG lens on the wafer-bonded support substrate after wafer bonding 329. An antireflection coating may be applied to the optoelectronic substrate back surface (e.g., before the standoff is deposited or otherwise provided).

In other examples, the support substrate is wafer bonded 329 with the HCG layer facing away from the optoelectronic substrate (e.g., as illustrated in FIG. 5). In particular, wafer bonding 329 may connect the support substrate to the back surface of the provided 310 optoelectronic substrate at a surface of the support substrate opposite a surface upon which the HCG layer is deposited. The HCG layer may be patterned into the HCG lens before or after wafer bonding 329 the support substrate to the optoelectronic substrate. An antireflection coating may be applied to the back surface of the optoelectronic substrate prior to wafer bonding 329, according to some examples.

In another example (not illustrated), the HCG lens may be formed by depositing $SiO_2$ or another suitable mask material as a mask layer (e.g., on a surface of the support substrate). The deposited mask layer is then patterned and etched (e.g., using a dry etch) according to an inverse pattern of the HCG lens to be formed. Material of the HCG lens (e.g., amorphous Si) is deposited to fill etched regions in the mask layer and may also cover a top surface of the mask layer or a portion thereof Any excess HCG lens material on the top surface of the mask layer may be removed, for example, using chemical mechanical polishing to leave behind the formed HCG lens (i.e., as the HCG lens material within the etched regions). In some examples, material of the mask layer may be subsequently removed from the formed HCG lens by selective etching. For example, when the HCG lens material is amorphous Si and the mask layer is $SiO_2$, the mask layer $SiO_2$ may be removed using an HF etchant to leave behind an amorphous Si HCG lens. In other examples, the mask layer material (e.g., $SiO_2$) may remain in between elements of the HCG lens (e.g., as a low refractive index material).

In yet other examples (not illustrated), the HCG lens may be formed in a layer on another substrate such as, but not limited to, a silicon-on-insulator (SOI) substrate. The other substrate may serve as a 'handle' wafer and the HCG lens may be formed in or on a portion of the handle wafer. For example, the HCG lens may be formed in a silicon device layer of the SOI substrate, for example. The handle wafer is then wafer bonded to the support substrate (with the HCG lens sandwiched therebetween), and the handle wafer (e.g., with the exception of the HCG lens) is removed after wafer bonding leaving behind a silicon dioxide handle layer on the HCG lens. In other examples, a silicon dioxide handle layer of the SOI substrate may be selectively etched (e.g., using an etchant including HF acid) to remove the silicon dioxide handle layer but to leave behind the HCG lens after wafer bonding to the support substrate. The support substrate may be wafer bonded to the optoelectronics substrate back surface either before or after the HCG lens is wafer bonded to the support substrate, for example, depending on whether the device of FIG. 4 or the device of FIG. 5 is to be fabricated.

Thus, there have been described examples of an optoelectronic apparatus and a method of fabricating optoelectronics that employ a high contrast grating as a lens. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A high contrast grating optoelectronic apparatus comprising:

an optoelectronic device at a front surface of a substrate, the optoelectronic device to one or both of emit light and detect light through a back surface of the substrate opposite the front surface;
a high contrast grating (HCG) lens adjacent to and spaced apart from the back surface of the substrate by a spacer that is disposed on the back surface of the substrate, the HCG lens to focus the light; and
wherein the spacer comprises a first material and a cavity between the HCG lens and the substrate back surface, the HCG lens encapsulated in an encapsulating material partially filling the cavity between the HCG lens and the back surface of the substrate, the encapsulating material comprising a second material different from the first material of the spacer.

2. The high contrast grating optoelectronic apparatus of claim 1, wherein the optoelectronic device comprises a back emitting vertical cavity surface emitting laser (BE-VCSEL), the light to be focused by the HCG lens being a laser emission of the BEVCSEL.

3. The high contrast grating optoelectronic apparatus of claim 1, wherein the optoelectronic device comprises a photodiode, the HCG lens to focus the light onto an active region of the photodiode.

4. The high contrast grating optoelectronic apparatus of claim 1, further comprising an antireflective coating on the substrate between the spacer and the back surface of the substrate.

5. The high contrast grating optoelectronic apparatus of claim 1, wherein the encapsulating material forms a cover layer on the HCG lens.

6. The high contrast grating optoelectronic apparatus of claim 1, wherein the HCG lens comprises a plurality of spaced apart grating elements and wherein the encapsulating material at least partially fills spaces between the grating elements.

7. An optoelectronic apparatus employing a high contrast grating comprising:
a transparent substrate having a first surface and a second surface opposite the first surface, the transparent substrate to transmit light at an operational wavelength of the optoelectronic apparatus;
an optoelectronic layer at the first surface of the transparent substrate, the optoelectronic layer to one or both of emit the light and detect the light;
a high contrast grating (HCG) layer adjacent to and spaced apart from the second surface of the transparent substrate by a spacer layer that is disposed on the second surface of the transparent substrate, the HCG layer to provide an HCG lens to focus the light; and
wherein the spacer layer comprises a first material and a cavity to suspend the HCG lens above the transparent substrate second surface,
the HCG lens encapsulated in an encapsulating material partially filling the cavity between the HCG lens and the second surface of the transparent substrate, the encapsulating material comprising a second material different from the first material of the spacer layer.

8. The optoelectronic apparatus employing a high contrast grating of claim 7, wherein the optoelectronic layer comprises one or both of a vertical cavity surface emitting laser (VCSEL) and a photodiode, the VCSEL to emit light in a direction towards the second surface, the emitted light to be focused by the HCG lens, the photodiode to be illuminated by and to detect light from the second surface, the light to be focused by the HCG lens onto the photodiode.

9. The optoelectronic apparatus employing a high contrast grating of claim 7, wherein the HCG lens is to one or both of focus the light into an optical fiber and focus the light from an optical fiber onto the optoelectronic layer to illuminate the optoelectronic layer.

10. The optoelectronic apparatus employing a high contrast grating of claim 7, wherein the spacer layer comprises the cavity between the HCG layer and the transparent substrate second surface, the optoelectronic apparatus further comprising a wafer-bonded substrate to support the HCG layer on a surface of the wafer-bonded substrate, the HCG layer being between the wafer-bonded substrate and the transparent substrate second surface.

11. The optoelectronic apparatus employing a high contrast grating of claim 7, wherein the spacer layer further comprises a wafer-bonded support substrate to suspend the HCG lens above the transparent substrate second surface, the HCG layer is on a surface of the wafer-bonded substrate opposite a surface of the wafer-bonded support substrate that is adjacent to the transparent substrate second surface.

12. The optoelectronic apparatus employing a high contrast grating of claim 7, further comprising an antireflective coating on the transparent substrate between the spacer layer and the second surface of the transparent substrate.

13. The optoelectronic apparatus employing a high contrast grating of claim 7, wherein the encapsulating material forms a cover layer on the HCG lens.

14. The optoelectronic apparatus employing a high contrast grating of claim 7, wherein the HCG lens comprises a plurality of spaced apart grating elements and wherein the encapsulating material at least partially fills spaces between the grating elements.

15. A method of fabricating high contrast grating based optoelectronics, the method comprising:
providing an optoelectronic substrate, the optoelectronic substrate to support an optoelectronic device on a front surface and to transmit light between the front surface and a back surface of the optoelectronic substrate;
forming a high contrast grating (HCG) lens, the formed HCG lens being adjacent to and spaced apart from the optoelectronic substrate back surface by a spacer layer disposed on the back surface of the optoelectronic substrate and the spacer layer comprising a first material and a cavity between the HCG lens and the back surface of the optoelectronic substrate, the HCG lens to focus the transmitted light;
encapsulating the HCG lens with an encapsulating material; and
partially filling the cavity between the HCG lens and the back surface of the optoelectronic substrate with the encapsulating material, the encapsulating material comprising a second material different from the first material of the spacer layer.

16. The method of fabricating high contrast grating based optoelectronics of claim 15, wherein forming the HCG lens comprises:
depositing an HCG layer onto the spacer layer;
patterning the HCG layer;
etching the patterned HCG layer to define the HCG lens; and
releasing the HCG lens to form the cavity in the spacer layer between the optoelectronic substrate back surface and the HCG lens.

17. The method of fabricating high contrast grating based optoelectronics of claim 15, wherein providing the optoelectronic substrate comprises forming the optoelectronic device in the front surface of the optoelectronic substrate and wherein the optoelectronic device comprises a back emitting vertical cavity surface emitting laser (BE-VCSEL).

18. The method of fabricating high contrast grating based optoelectronics of claim 15, wherein the HCG lens is partially encapsulated with the encapsulating material.

19. The method of fabricating high contrast grating based optoelectronics of claim 15, wherein an anisotropic deposition technique is employed to deposit the encapsulating material to partially fill the cavity between the HCG lens and the back surface of the optoelectronic substrate with the encapsulating material.

20. The method of fabricating high contrast grating based optoelectronics of claim 15, wherein the encapsulating material comprises silicon nitride.

21. The method of fabricating high contrast grating based optoelectronics of claim 15, further comprising depositing an antireflective coating on the back surface of the optoelectronic substrate prior to depositing the HCG layer onto the spacer layer such that the formed HCG lens is spaced apart from the antireflective coating by the spacer layer disposed on the antireflective coating.

22. The method of fabricating high contrast grating based optoelectronics of claim 15, wherein encapsulating the HCG lens with the encapsulating material comprises forming a cover layer on the HCG lens with the encapsulating material.

23. The method of fabricating high contrast grating based optoelectronics of claim 15, wherein encapsulating the HCG lens with the encapsulating material comprises at least partially filling spaces between grating elements of the HCG lens with the encapsulating material.

\* \* \* \* \*